United States Patent [19]
Corio

[11] Patent Number: 5,374,940
[45] Date of Patent: Dec. 20, 1994

[54] SYSTEM FOR OPERATING A PLURALITY OF GRAPHICS DISPLAYS FROM A SINGLE COMPUTER

[75] Inventor: Mark A. Corio, Rochester, N.Y.

[73] Assignee: The University of Rochester, Rochester, N.Y.

[21] Appl. No.: 710,221

[22] Filed: Jun. 4, 1991

[51] Int. Cl.[5] ............................................. G09G 5/00
[52] U.S. Cl. ........................................ 345/1; 345/200
[58] Field of Search ............... 340/717, 789, 723, 804, 340/794; 345/1, 2, 9, 10, 185, 189, 190, 200

[56] References Cited

U.S. PATENT DOCUMENTS

| 4,015,422 | 4/1977 | Van Haaften | 340/718 |
| 4,217,646 | 8/1980 | Caltagirone et al. | 340/310 R |
| 4,800,376 | 1/1989 | Luga et al. | 345/1 |
| 4,922,448 | 5/1990 | Kurieda et al. | 340/717 |
| 5,012,229 | 4/1991 | Lennon et al. | 345/1 |
| 5,021,770 | 6/1991 | Aisaka et al. | 345/1 |
| 5,039,937 | 8/1991 | Mandt et al. | 340/723 |

FOREIGN PATENT DOCUMENTS

| 354145435 | 11/1979 | Japan | 345/1 |
| 0165135 | 9/1984 | Japan | 340/717 |
| 0194232 | 11/1984 | Japan | 340/717 |
| 0120428 | 6/1985 | Japan | 340/717 |
| 0254226 | 12/1985 | Japan | 340/717 |
| 0129390 | 6/1991 | Japan | 340/717 |

Primary Examiner—Richard Hjerpe
Assistant Examiner—Lun-Yi Lao
Attorney, Agent, or Firm—M. Lukacher

[57] ABSTRACT

Multiple video boards of the general purpose type (e.g. EGA or VGA boards) and their associated monitors are operated by a single computer of the personal computer type, without modification of the computer hardware and while the video boards reside in their usual expansion slots which are provided by connectors on the mother board of the personal computer by a system which utilizes a flexible printed circuit board containing circuits which allows the processor (CPU) of the computer to present address and data signals which operate circuitry on the flexible boards to selectively enable or inhibit the communication of control signals (on the I/O and memory read and write control lines) to the video boards thereby enabling them to generate graphical images for their associated monitors. The signals on the address control and data lines are tapped and relayed either directly or after processing to the associated video board thereby enabling multiple video boards of the same or different types to be used concurrently by appropriate programming of the computer without the need to interchange hardware to switch between displays thereby reducing the inconvenience and potential hardware damage necessarily incident to such a hardware interchange procedure.

5 Claims, 5 Drawing Sheets

SYSTEM FOR OPERATING A PLURALITY OF GRAPHICS DISPLAYS FROM A SINGLE COMPUTER

DESCRIPTION

The present invention relates to a system for operating simultaneously a plurality of graphics displays in response to digital data and control signals generated by a single central processing unit without the need for special purpose, expensive video graphics adaptors. This invention was made with government support under Grant No. GM-38645 awarded by the National Institutes of Health. The government has certain rights in the invention.

The invention is especially suitable for providing a system which enables a personal type computer (e.g. a single IBM PC/AT type computer) to address multiple graphics displays thereby accommodating applications requiring more graphical information than allotted by a single display. The invention also enables displays of different types (e.g. standard graphics or 3D-stereo displays) to be used simultaneously with each display being updated successively and with all displays operating at the same time.

Heretofore, simultaneous (by which is also meant to include concurrent) operation of multiple graphical displays, has required specialized video hardware to permit the multiple graphics monitors (screens) to be connected to and controlled by a single personal computer. The conventional way of operating multiple displays with a personal computer is to interchange the video boards which are known as graphic adaptor boards (e.g. VGA or EGA boards).

Multiple video boards cannot be used in and driven from the bus of the computer in that the video memory (i.e. the memory locations where the display image is stored on the video adaptor board circuitry and the video boards control registers) are at the same addresses for each board. Therefore, the CPU of the personal computer is unable to distinguish between the different video boards and thus, cannot communicate with them individually. In other words, the operating system of the personal computer is programmed on the basis that the video adaptors reside at particular addresses. General purpose video adaptors which are commercially available are not designed to change their addresses in order to preserve their usefulness as general purpose devices. Thus, multiple conventionally designed video boards cannot be used by the operating system by selecting different addresses. It is a feature of this invention to permit the use of general purpose video boards or special boards (e.g. those designed for use with special displays such as flat screens based on liquid crystal diode (LCD) arrays or stereo display systems) by allowing them to reside at their normal addresses and individually selecting them for communication with the central processing unit (CPU) of the computer.

It is the principal object of the present invention to provide an improved system for operating a plurality of graphics displays from a single computer, especially a personal computer, without modification of any of the existing personal computer hardware, requiring only programming to selectively address the displays.

It is a further object of the present invention to provide an improved system for operating different types of displays, such as standard graphics and LCD 3D stereo displays, concurrently while avoiding the need to change hardware (graphic adaptor boards) to select the display to be used or updated with new graphic information, thereby reducing inconvenience and preventing damage to the hardware incident upon interchange of the boards needed to accommodate the different displays.

It is a still further object of the present invention to provide an improved system for operating simultaneously a plurality of graphics displays which allows the video boards of the displays to reside at their normal addresses by interrupting and multiplexing the read and write control lines to each of them while allowing other bus signals to remain connected to each of the video boards in the normal manner (such normally connected signals being for example the address bus, data bus, interrupt and DMA control lines).

It is a still further object of the present invention to provide an improved system for operating simultaneously a plurality of graphics displays wherein to write to the video memory of a selected graphics adaptor circuit (usually on an adaptor board, such as a VGA or EGA board), the CPU places the memory address to be written on the address bus and the data to be written, to the addressed location in memory, on the data bus. The video board operates conventionally in response to these data and address signals decoding the address from the address bus and communicating the data to the memory location that the CPU addresses. To complete the write operation, however, the CPU must strobe the memory write line to the video board so as to cause it to place the data that is on the data bus into the memory location specified by the address bus. If this control signal is not received, the video board takes no action. The same is the case with the memory read, I/O read and I/O write operations which are carried out with the video adaptor circuits. In other words, these operations only are completed by the video board when it receives the appropriate control signals. The present invention intercepts these control signals and allows them to pass only to the selected video boards. All others of the multiplicity of video boards, which are used in the system, receive no read or write control signals and thus, are not enabled to change the display on the their associated monitor or screen. The boards continue to operate on the graphical information generated by their associated boards so that all of the multiplicity of displays are concurrently in operation.

It is still another object of the invention to provide a system for operating simultaneously a plurality of graphics displays utilizing video adaptor boards for each display which use the computer's available bus outputs, e.g. by being connected in the standard expansion slots. A board is used which contains the circuitry for intercepting and relaying the data and control signals and selecting the desired display to be updated. This board is interposed (by having contacts which are sandwiched between the existing contacts in the expansion slot connectors and on the video boards) thereby allowing the data and control signals to be tapped, used by the inserted board and relayed to the video board.

Thus, the invention, briefly described, provides a system for operating simultaneously a plurality of graphics displays in response to digital data and control signals generated by a single central processing unit, which signals are presented at a plurality of outputs along a bus which is connected to the central processing unit. A plurality of separate graphics adaptor circuits (referred to "video boards" in the following detailed description of an embodiment of the invention) are used which generate graphic images representing data in response to the data signals and the control signals. Each adaptor circuit operates a different one of the displays to present graphics images thereon. The system is made up of a plurality of separate means each connected between a different one of the plurality of outputs and a different one of the plurality of adaptor circuits and, of course, corresponds to a different one of these adaptor circuits. These means intercept certain of the control and data signals without interfering with the transmission of the data signals and certain other of the control signals (e.g. address signals) used by the adaptor circuits for generating the image representing the data. These intercepting means include means responsive to certain of the data and control signals for selectively blocking and applying the control signals to different ones of the adaptor circuits for selectively enabling the circuits to generate the image representing data therein.

The foregoing and other objects, features and advantages of the invention, as well as a presently preferred embodiment thereof, will become more apparent from a reading of the following description in connection with the accompanying drawings in which:

FIG. 3A is an enlarged sectional view showing one of the contact fingers on the flexible printed circuit board;

Figure 1:
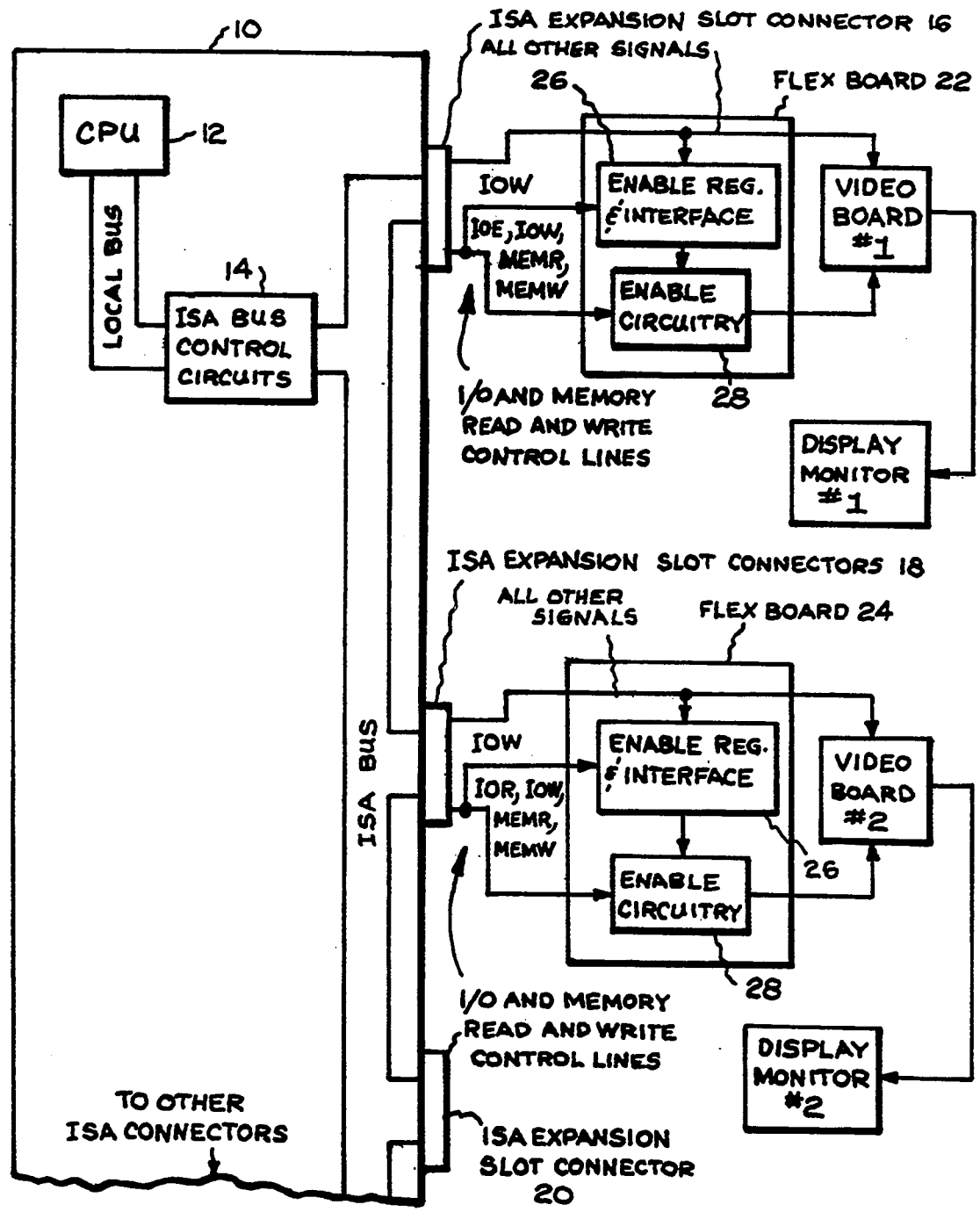
FIG. 1 is a block diagram, schematically illustrating a system for operating a plurality of graphics displays in accordance with the invention.

Referring to FIG. 1 there is shown the mother or backplane board 10 of a personal computer such as an IBM PC/AT. For the sake of simplicity, only the CPU 12 and the ISA (industry standard architecture) bus control circuits 14 and three of the expansion slot connectors 16, 18 and 20 are shown mounted on the board 10; the remaining integrated circuits and printed wiring being omitted. The CPU is connected by way of the local bus (which has individual data address and control lines) to the bus control circuits 14 for communicating with the rest of the personal computer hardware (not shown) and connector slots other than the expansion slot connectors 16, 18 and 20 which are shown.

Two of these expansion slot connectors 16 and 18 receive different video boards such as standard VGA or EGA boards. Alternatively, one of these boards may be a standard graphics display such as a VGA or EGA board, while the other is a specialized display for an LCD monitor which may be a 3-D stereo monitor of the type available from Dimension Technologies Inc. of Rochester, N.Y. The drawing designates these displays as display monitor #1 and display monitor #2. They are driven by graphic adaptor circuits on video board #1 and video board #2. These video boards are received in the expansion slots and connected via contacts thereon to the expansion slot connectors.

In order to selectively communicate the address data and control signals from the ISA bus to the video boards, intercepting circuits are mounted on flexible (flex) printed circuit boards 22 and 24, which are received in the expansion slots and connected to the connectors thereof, for tapping the address, data and control signals and relaying them to the video boards. Some signals bypass the boards 22 and 24 while others are intercepted and relayed to the boards. The latter are the I/O write, I/O read, memory read and memory write control signals (IOW, IOR, MEMR and MEMW). The signals which are passed through to the video boards are all other signals. One data line and ten address lines are tapped. In addition, but not shown in FIG. 1, are the address enable (AEN) and reset lines which are also tapped at the flex boards 22 and 24.

On the flex boards, which are identical, is an enable register and interface 26 and enable circuitry 28. The interface provides for selecting which of the video displays (either video board 1 and display monitor 1 or video board 2 and display monitor 2 in this illustrative embodiment of the invention) is to be updated with data from which graphic information is generated in the video boards. The video boards have memory, processor and sync circuits which map the data into corresponding images and apply them to the monitors so that the images are displayed thereon.

The interface part of the enable register and interface circuits 26 decodes the addresses and allows the enable register to be strobed after an address enable command and an I/OW command occur in response to the data on the data lines. The enable register provides an output for enabling the enable circuitry 28. This circuitry constitutes logic which enables the I/O and memory read and write control signals to be relayed to the I/O read and write and memory read and write inputs of the video boards. It is only when the enable circuity 28 is enabled that these control signals can be relayed. Thus, although the address and data signals are communicated to the video boards, only that video board which is selected will be updated with new image representing data. It will therefore be apparent that a multiplicity of displays can be operated by suitably programming the personal computer.

Figure 2:
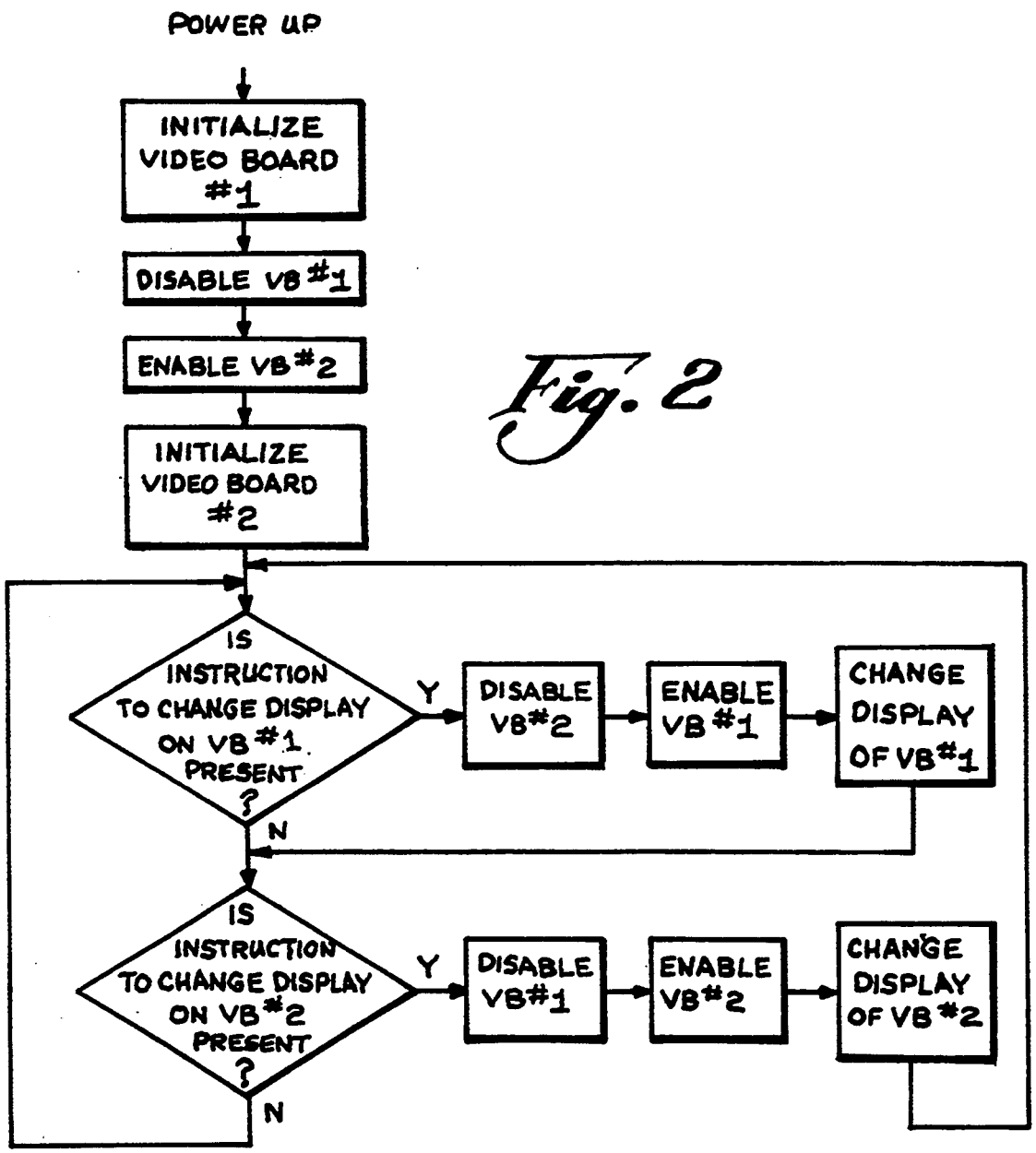
FIG. 2 is a flow chart illustrating the programming of the system shown in FIG. 1.

An embodiment of the program to enable the display on monitor #1 or monitor #2 to be updated or changed is shown in the flow chart of FIG. 2. Referring to FIG. 2, on power up the first video board (VB#1) is initialized. This is accomplished by applying the reset signal through a jumper which programs which of the video boards is to be initially enabled and disabled. The programming hardware (the jumpers 30) will become more apparent hereinafter from FIG. 5. The boards are successively initialized, disabled and enabled to be initialized until both boards are initialized. In the initialized condition one board, in this case video board #1, is enabled by the reset signal while board #2 is disabled on power up.

Next, the program receives an instruction to change the display on video board #1. If that instruction is detected, video board #2 is disabled and video board #1 is enabled. Then the display on video #1 is updated or changed. Of course, if this is the initial display from a blank screen, the initial display will then be generated and seen on monitor #1.

If there is no instruction to change the display on video board #1, the program looks for an instruction to change the display on video board #2. Then video board #1 is inhibited from changing its display and video board #2 is enabled. The display on video board

2 is either initially provided or changed. At this time the display on video board #1 remains on. It is not blanked. The display continues to be shown. In this way, a multiplicity of displays can be simultaneously and concurrently generated and observed while different ones of the displays are successively changed or updated. The program continues to loop back, either if there are no instructions to change either display or after instructions to change all of the displays are successively checked for change display instructions.

Figure 3:
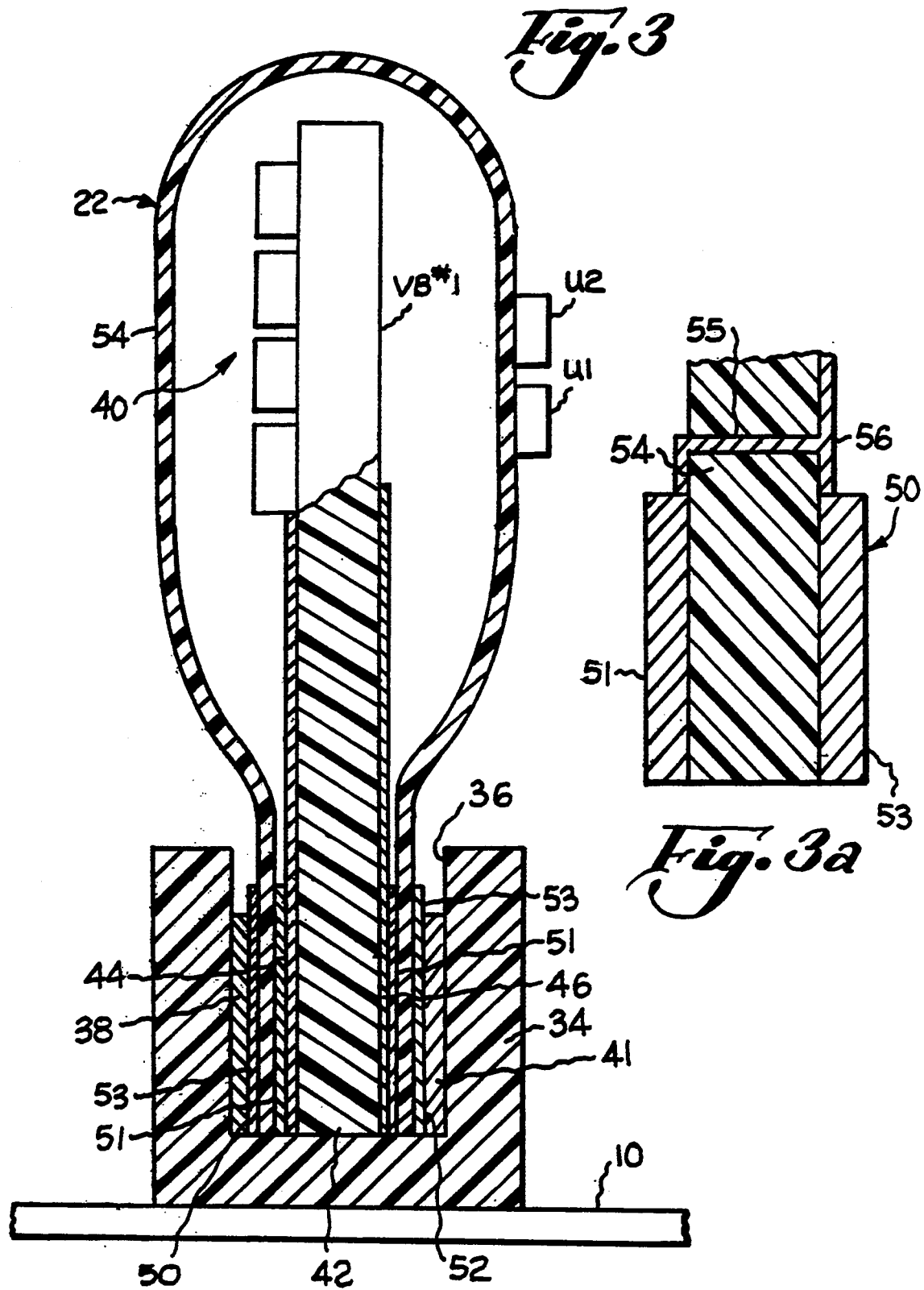
FIG. 3 is a sectional view through the back plane expansion slot connector, adaptor board and a flexible printed circuit board which is used in a preferred embodiment of the system shown in FIG. 1.
Figure 4:
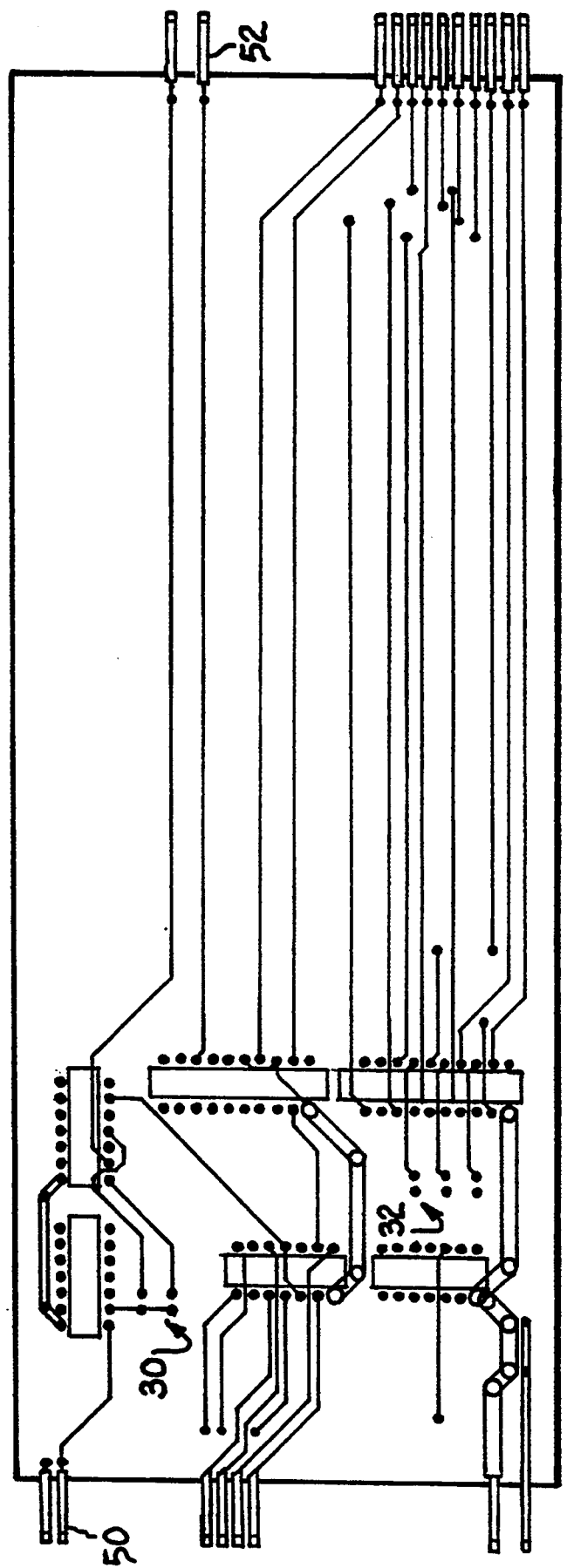
FIG. 4 is a top view of the flexible printed circuit board shown in FIG. 3.

Referring to FIGS. 3, 3A and 4 there is shown the mechanical arrangement of the flex boards 22 or 24 which are identical except for the ones of the jumpers 30 or 32 which are connected. As shown in FIG. 4 the lower jumper 30 of a pair of jumpers which determines whether the video board associated with this flex board 22 is to be enabled or disabled on initialization is connected. All of the jumpers 32 which program the selection of the video boards in response to address data from the personal computer CPU 12 (FIG. 1) are shown connected in FIG. 4.

The flex board 22 includes a substrate of dielectric material which has conductive material on opposite sides thereof. Wiring on each side of the flex board interconnect integrated circuits, which are chips indicated at U1, U2, U3, U4 and U5. See FIG. 5. U1 is an eight bit comparator, as is U2. U3 is a quad (4-unit) OR gate. U5 is a hex inverter. Only one inverter stage of the U5 chip is used in this embodiment of the invention. U6 is a quad OR gate, only one of which gates is used in this embodiment of the invention. There are also capacitors (CAPS) and power supply circuits which are not shown in the Figures to simplify the illustration. The opposite side of the flex board 22 is not shown. It has printed wiring or conductive areas which afford the circuitry shown in FIG. 5.

FIG. 3 shows the back plane 10 and one of the connectors which provides one of the bus outputs. The connector is housed in a body 34 of insulating material having a slot 36. The slot has a row of connector contacts spaced therealong. Two of these contacts are indicated at 38 and 41. They may be strips of spring material. The slot connectors so far described are conventional. Also the video board has, as is conventional, an array of integrated circuit chips, such as memory and other chips mounted thereon as shown at 40. The board is inserted into the slot 36. The board has contacts extending from the lower edge 42 which may be indexed against the bottom of the slot upwardly along the opposite sides of the board. Two of these contacts are shown at 44 and 46.

The flexible board 22 has fingers 50 extending from one of the opposite edges thereof and fingers 52 extending from the other of the opposite edge thereof. These sets of fingers 50 & 52, as shown in FIG. 4, may be spaced with the same spacing as the contacts 38 and 40 of the slot connector. However, there are gaps between the fingers. In such case, contact is made between the slot connector contacts 38 and 41 and the video board edge contacts 44 and 46. The contacts, which do not have fingers of the flex board interposed, are those which are connected to data and address or control lines which are not tapped by or relayed through the circuitry on the flexible board 22. The lines which are tapped are presented by connector and video board contacts which are engaged by contacts provided by conductive material layers 51 and 53 on opposite sides of the fingers. These contacts may be connected through plated-through holes through the substrate 54 of the flexible board 22 which is extended to provide the fingers 50 and 52. Lines such as indicated at 56 in FIG. 3A of printed wiring on the substrate 54 of the flexible board 22 taps the signals on the lines connected to the contacts 51 and 53. The plated-through hole 55 serves to relay the signals by providing a continuous connection for the line from the finger contact 51 to the finger contact 53 through the plated-through hole 55.

As shown in FIG. 3, the flexible printed circuit board is wrapped around and over the video board and the fingers 50 and 52 are inserted between the slot connector contacts and the video board contacts which are aligned therewith. The finger contacts which protrude into the slots enable the signals to be tapped and, if necessary, relayed through the circuits on the flexible board via the finger contacts to the video board around which the flexible board is wrapped.

It will be seen, therefore, that there are no hardware changes which are necessary to be made in the circuitry of the computer either on its mother board, connectors or video boards. The additional hardware is provided by the flexible printed circuit boards one of which is used for each video board when multiple video boards and their associated displays are used with the personal computer.

Figure 5:
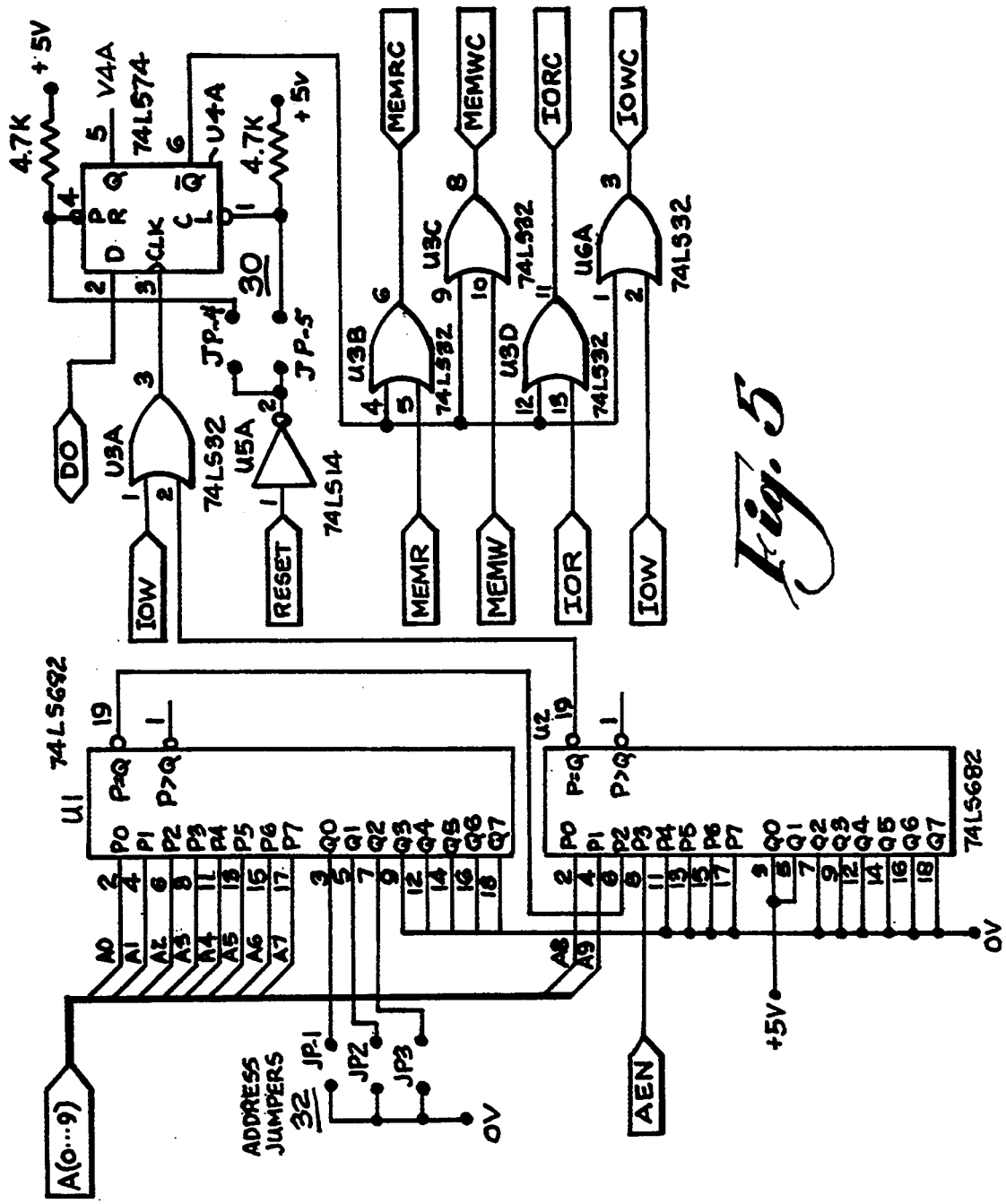
FIG. 5 is a schematic diagram of circuitry on the flexible printed circuit board.

The circuitry on each flexible board 22 is shown in FIG. 5. FIG. 5 indicates by its nomenclature the presently preferred type of integrated circuit chip which is used (e.g., 74LS682 for the U1 and U2 chips).

In this embodiment of the invention the capability is provided for multiplexing eight video boards and their associated displays. The addresses of these displays is 300 through 307 in hexadecimal notation. Therefore, ten address lines are used and three are programmed by the address jumpers 32. For example, when all three jumpers JP1, JP2 and JP3 are connected, the program will write in its instruction to access the video board and display associated with the flexible circuit board as 300 hex. When a comparison exists, together with receipt of an address enable AEN, an output from U2 which is active low (ground rather than plus five volts) is applied to U3A, one of the OR gates of the U3 chip. Upon further receipt of an IOW control signal, a latch U4A, which provides the enable register of the enable register and interface circuits 26 (FIG. 1), is clocked or strobed. Then the data on data line 0 (D0), if high, drives the not Q output of the latch U4A low. This low output enables gate logic consisting of U3B, U3C, U3D and U6A, because the enable signal is active when low. Then the MEMR, MEMW, IOR and IOW lines, which are active low and inactive high, are relayed through the OR gates U3B, U3C, U3D and U6A to the video board.

The contacts indicated as MEMR and MEMRC are contacts on opposite sides of the fingers such as shown at 51 and 53 in FIG. 3A or they may be different fingers. However, it is preferred to use the opposite side fingers since the conventional alignment of the lines between the slot connector contacts and the video board contacts is maintained. Until these control signals are relayed, the video board associated with the flex board cannot be updated by being written to and read from.

For initialization, the reset line which is desirably tapped by contacts on opposite sides of the same finger on the flex board (which is connected as shown in FIG. 3A) is inverted by one of the inverters U5A. When JP4 of the jumpers 30 is interconnected, the inverted reset signal, when it goes active low, applies a command to the preset (PR) input of the latch U4A and sets the not Q output thereof low thereby initially enabling the logic gates U3B, U3C, U3D and U6A. If the video board and display is to be initially disabled, the JP5 jumper is instead connected and the latch is cleared upon receipt of a reset command thereby driving not Q high and inhibiting the gates U3B, U3C, U3D and U6A.

From the foregoing description, it will be apparent that there has been provided an improved system for operating a multiplicity of video displays from a single computer. A preferred embodiment of the invention has been described. It will be appreciated that variations and modifications thereof will undoubtedly suggest themselves to those skilled in the art. Accordingly the foregoing description should be taken as illustrative and not in a limiting sense.

I claim:

1. A system for operating simultaneously a plurality of graphics displays in response to a plurality of digital data and control signals generated by a single central processing unit, which signals are presented at a plurality of outputs along a bus which is connected to said central processing unit, a plurality of separate graphics adaptor circuits connected to a corresponding graphics display for generating graphic image representing data in response to said data signals and said control signals and said plurality of displays presenting graphics images thereon, said system comprising a plurality of separate intercepting means each connected between a different one of said plurality of outputs and a different one of said plurality of adaptor circuits, and each of said intercepting means corresponding to a different one of said plurality of adaptor circuits, said intercepting means being operative for intercepting said control and data signals without interfering with the transmission of said data signals and those of said control signals used by said adaptor circuits for generating said image representing data, and means included in each of said plurality of intercepting means and responsive to said control and data signals for selectively blocking and applying control signals other than those which are used to generate said image representing data to said adaptor circuits to generate said image representing data therein with up-dated and un-updated data concurrently on each of said plurality of displays, and wherein said control signals include address signals and signals for controlling reading from and writing of data to said adaptor circuits, and said blocking and applying means of each of said intercepting means comprises (a) logic means for applying said control signals to said corresponding adaptor circuits when enabled, (b) decoding means responsive to said address signals for enabling selection of said corresponding adaptor circuits and the one of said plurality of graphics displays operated thereby and (c) selective enabling means enabled by said decoding means for selectively enabling said logic means in response to at least one of said data signals.

2. The system according to claim 1 wherein said decoding means includes means for programming said decoding means to provide a first output in response to a unique combination of said address signals, said selective enabling means being responsive to said first output.

3. The system according to claim 2 where said enabling means comprises register means enabled by said first output for storing said certain data signal to provide a second output corresponding thereto, and said logic means includes means responsive to said second output for selectively enabling said logic means to transfer said certain control signals to the one of said plurality of adaptor circuits corresponding to the intercepting means of which said logic means is comprised.

4. The system according to claim 3 wherein said logic means for said plurality of intercepting means includes a plurality of gates each selectively enabled by said second output for transferring a different one out of said certain control signals to said adaptor circuit corresponding to the one of said intercepting means of which it is comprised.

5. The system according to claim 4 further comprising means for initially conditioning said register means of one of said intercepting means to provide said second output of a value to enable the logic means responsive thereto.

* * * * *